United States Patent
Ochi et al.

(10) Patent No.: US 6,459,046 B1
(45) Date of Patent: Oct. 1, 2002

(54) PRINTED CIRCUIT BOARD AND METHOD FOR PRODUCING THE SAME

(75) Inventors: Shozo Ochi, Osaka (JP); Fumio Echigo, Osaka (JP); Yoji Ueda, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/919,319

(22) Filed: Jul. 31, 2001

(30) Foreign Application Priority Data

Aug. 28, 2000 (JP) .................................. 2000-257260

(51) Int. Cl.[7] ............................................... H05K 1/03
(52) U.S. Cl. ..................... 174/256; 174/255; 174/262; 174/264; 361/792; 361/803
(58) Field of Search .......................... 174/256, 255, 174/258, 259, 261, 262, 264, 263, 266; 361/792, 793, 803; 428/209

(56) References Cited

U.S. PATENT DOCUMENTS

| | | | | |
|---|---|---|---|---|
| 5,817,404 A | * | 10/1998 | Kawakita et al. | 428/209 |
| 5,837,155 A | * | 11/1998 | Inagaki et al. | 216/18 |
| 6,127,633 A | * | 10/2000 | Kinoshita | 174/259 |
| 6,217,988 B1 | * | 4/2001 | Yasue et al. | 428/209 |
| 6,320,140 B1 | * | 11/2001 | Enomoto | 174/264 |
| 6,329,610 B1 | * | 12/2001 | Takubo et al. | 174/264 |

FOREIGN PATENT DOCUMENTS

| | | |
|---|---|---|
| EP | 0 568 930 | 11/1993 |
| EP | 0 961 533 | 12/1999 |
| JP | 2601128 | 1/1997 |
| JP | 2000-77800 | 3/2000 |
| JP | 2000-340954 | 8/2000 |

* cited by examiner

Primary Examiner—Albert W. Paladini
Assistant Examiner—J B Patel
(74) Attorney, Agent, or Firm—Merchant & Gould P.C.

(57) ABSTRACT

A printed circuit board of the present invention is formed of an electrical insulating base material with through holes that are formed in a thickness direction of the electrical insulating base material and are filled with an electrical conductor; the electrical insulating base material including a core layer formed by impregnating a holder with a resin and resin layers formed on both sides of the core layer; and wiring layers that are formed on both surfaces of the electrical insulating base material into a predetermined pattern and are electrically connected to each other by the electrical conductor. The wiring layer is embedded in at least one of the resin layers. The resin layers on the both sides have different thicknesses from each other, and a thinner layer out of the resin layers has a thickness equal to or smaller than a mean particle diameter of an electrically conductive filler contained in the electrical conductor. By adjusting the thickness of the resin layers formed on both sides of the resin holder such as a glass cloth, it is possible to ensure high reliability when electrically connecting circuit boards using an electrically conductive paste as the electrical conductor.

9 Claims, 7 Drawing Sheets

PRINTED CIRCUIT BOARD AND METHOD FOR PRODUCING THE SAME

BACKGROUND OF THE INVENTION

1. Field of the Invention

The present invention relates to a printed circuit board and a method for producing the same.

2. Description of Related Art

Accompanying the reduction in size, thickness and weight of electronic equipment and the improvement in performance thereof in recent years, various technologies enabling a high-density packaging have been developed actively not only in various types of electronic components constituting the electronic equipment, but also in printed circuit boards on which these electronic components are mounted. In particular, along with the rapid advancement of the packaging technology recently, there is an increasing demand for low-cost multilayered circuit boards that can both achieve a high-density packaging of semiconductor chips such as LSIs and respond to high speed circuitry. In such printed circuit boards, it is important to have high electrical connection reliability between wiring patterns, which are formed on multiple layers with a fine wiring pitch, and high frequency characteristics.

In response to this, a printed circuit board in which layers are electrically connected using an electrically conductive paste has been proposed recently in JP 2601128 B. FIGS. 6A to 6G show a method for producing this printed circuit board. First, as shown in FIG. 6A, release films 501 made of polyester or the like are laminated on both surfaces of a porous base material 502 such as an aramid-epoxy prepreg that is obtained by impregnating an aramid nonwoven fabric with a thermosetting epoxy resin. Next, as shown in FIG. 6B, through holes 503 are formed at predetermined positions in the porous base material 502 by laser processing. Then, the through holes 503 are filled with an electrically conductive paste 504 as shown in FIG. 6C. As a filling method, the porous base material 502 with the through holes 503 is placed on a table of a screen printing machine and the electrically conductive paste 504 is printed directly over one of the release films 501. In this case, the release film 501 on the printed side serves as a print mask and to prevent the surface of the porous base material 502 from being contaminated. Subsequently, the release films 501 are peeled off from the both surfaces of the porous base material 502. Then, metal foils 505 such as copper foils are laminated on the both surfaces of the porous base material 502. With this state maintained, heating and compression are carried out, so that the porous base material 502 is compressed to be thinner as shown in FIG. 6D. Simultaneously, the electrically conductive paste 504 within the through holes 503 also is compressed, and a binder component contained in the electrically conductive paste 504 is forced out, thus strengthening the adhesion between electrically conductive components and between the electrically conductive component and the metal foils 505. As a result, the electrically conductive substance contained in the electrically conductive paste 504 becomes dense, thus achieving an electrical connection between layers. Thereafter, the thermosetting resin constituents of the porous base material 502 and the electrically conductive paste 504 are cured. Then, as shown in FIG. 6E, the metal foils 505 are etched selectively into a predetermined pattern, thus completing a double-sided circuit board. Furthermore, as shown in FIG. 6F, porous base materials 506 on which an electrically conductive paste 508 is printed and metal foils 507 are attached on both sides of the double-sided circuit board, followed by heating and compression. Subsequently, as shown in FIG. 6G, the metal foils 507 are etched selectively into a predetermined pattern, thus completing a multilayered circuit board.

However, in the structure and the producing method described above, when the aramid-epoxy prepreg is used, there is a slight deterioration in characteristics observed under a severe environment where electronic equipment causing a sharp temperature change is used. Accordingly, resin circuit boards with still higher reliability have been desired.

In order to solve these problems, it has been considered that a glass-epoxy prepreg obtained by impregnating a glass cloth with a thermosetting epoxy resin is used as an electrical insulating base material. However, in the glass-epoxy prepreg, resin layers having the same thickness are formed on both sides of the glass cloth. Accordingly, when the copper foil is laminated on one surface and the substrate on which a certain pattern is formed is laminated on the other surface, an excessively large amount of the resin causes a resin flow on the copper foil side, making it difficult to obtain connection reliability, while an excessively small amount thereof makes it difficult to obtain a sufficient adhesion on the patterned layer side. Alternatively, when the patterned substrates having a different thickness are laminated on the respective surfaces, an excessively large amount of the resin causes a resin flow on the side of the thinner patterned layer, making it difficult to obtain connection reliability, while an excessively small amount thereof makes it difficult to obtain a sufficient adhesion on the side of the thicker patterned layer.

SUMMARY OF THE INVENTION

It is an object of the present invention to solve the conventional problems described above and to provide a printed circuit board and a method for producing the same, in which, by adjusting the thickness of resin layers formed on both sides of a resin holder such as a glass cloth, high reliability can be achieved when layers are electrically connected by an electrical conductor such as an electrically conductive paste.

In order to achieve the above-mentioned object, a printed circuit board of the present invention includes an electrical insulating base material with through holes that are formed in a thickness direction of the electrical insulating base material and are filled with an electrical conductor; the electrical insulating base material including a core layer formed by impregnating a holder with a resin and resin layers formed on both sides of the core layer; and wiring layers that are formed on both surfaces of the electrical insulating base material into a predetermined pattern and are electrically connected to each other by the electrical conductor. The wiring layer is embedded in at least one of the resin layers. The resin layers on the both sides have different thicknesses from each other, and a thinner layer out of the resin layers has a thickness equal to or smaller than a mean particle diameter of an electrically conductive filler contained in the electrical conductor.

Furthermore, a method for producing a printed circuit board of the present invention includes laminating release films on both surfaces of an electrical insulating base material, the electrical insulating base material including a core layer including a prepreg formed by impregnating a holder with a resin and resin layers that are formed on both sides of the core layer and have different thicknesses from each other, providing through holes in a thickness direction of the electrical insulating base material, filling the through holes with an electrically conductive paste, superposing a wiring base material, on which a wiring layer is formed into a predetermined pattern so as to correspond to a portion filled with the electrically conductive paste, on at least one surface of the electrical insulating base material, and embedding the wiring layer in at least one of the resin layers on the electrical insulating base material by heating and compressing the electrical insulating base material on which the wiring base material has been superposed.

The present invention can form a via hole and a wiring layer with high reliability. In other words, at least one of the wiring layers is embedded in the resin layer, thereby compressing the electrical conductor within the through holes sufficiently. As a result, a conductor component of the electrical conductor becomes dense, thus allowing a via-hole connection with high reliability. In addition, the resin layers on both sides have a different thickness. Therefore, when the copper foil and the substrate on which different patterns are formed are laminated, or when the patterned substrates having a different thickness are laminated, it is possible to design the thickness of those resin layers so as to achieve high connection reliability and adhesive strength.

DESCRIPTION OF THE PREFERRED EMBODIMENTS

Figure 1A:
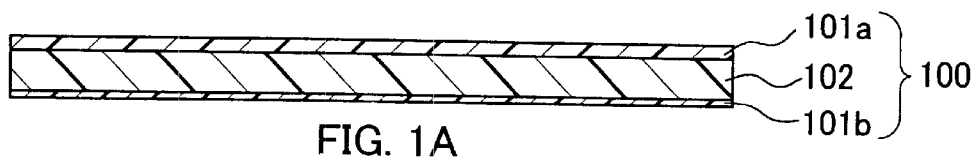
FIGS. 1A to 1H are sectional views illustrating processes in a method for producing a double-sided circuit board according to a first embodiment of the present invention.

In a printed circuit board of the present invention, a thinner layer out of the resin layers has a thickness substantially equal to or smaller than a mean particle diameter of the electrically conductive filler contained in the electrically conductive paste. With this structure, even when the resin layers are heated and melted, the electrically conductive filler can be. prevented from flowing out. As a result, a via-hole connection with conduction reliability can be achieved.

Furthermore, it is preferable that the resin layers formed on both sides of the holder have a thickness equal to or smaller than that of the wiring layer embedded in the resin layers. With this structure, the wiring layers can be embedded substantially to the glass cloth, making it possible to minimize an escape of pressure exerted on the electrical conductor owing to the spread of the resin layer in a horizontal direction.

Moreover, it is preferable that the electrical conductor is an electrically conductive paste. With this structure, when the electrically conductive paste within the through holes is compressed, a resin component in the electrically conductive paste is pressed out from the through holes, so that a conductor component contained in the electrically conductive paste becomes dense, achieving a via-hole connection with high reliability.

In addition, it is preferable that the holder is a glass cloth and the resin is a thermosetting epoxy resin. This improves an adhesive strength between a substrate material and metal foils such as copper foils. Thus, when electronic components or the like are mounted on a wiring pattern formed on this substrate, it becomes possible to obtain high packaging strength. Also, since the moisture resistance improves, layers are prevented from being separated, causing no change in connection resistance during reliability tests such as a temperature cycling test or a pressure cooker test.

It is preferable that the through holes are formed with a laser beam. This makes it possible to form the through holes having a fine diameter easily and rapidly, corresponding to ever finer wiring patterns.

Also, it may be possible to form a multilayered printed circuit board in which a plurality of the printed circuit boards are laminated. In this manner, a multilayered printed circuit board having a via-hole connection with high reliability can be provided.

Next, in accordance with a method for producing a printed circuit board of the present invention, a new printed circuit board that has a still higher reliability than a conventional printed circuit board and that can form a minute wiring pattern allowing a high-density packaging of superminiature electronic components can be obtained at low cost.

In addition, it is preferable that the wiring base material includes a glass-epoxy base material that has through holes filled with an electrically conductive paste and at least one surface on which the wiring layer is formed. With this structure, it becomes possible to laminate the wiring base materials while applying a sufficient compression force to the electrical conductor within the through holes in the glass-epoxy prepreg. Therefore, it is possible to achieve a multilayered printed circuit board of the glass-epoxy base material having a via-hole connection with high reliability.

The following is a description of embodiments of the present invention, with reference to the accompanying drawings.

Method for Producing Glass-Epoxy Prepreg

Figure 5:
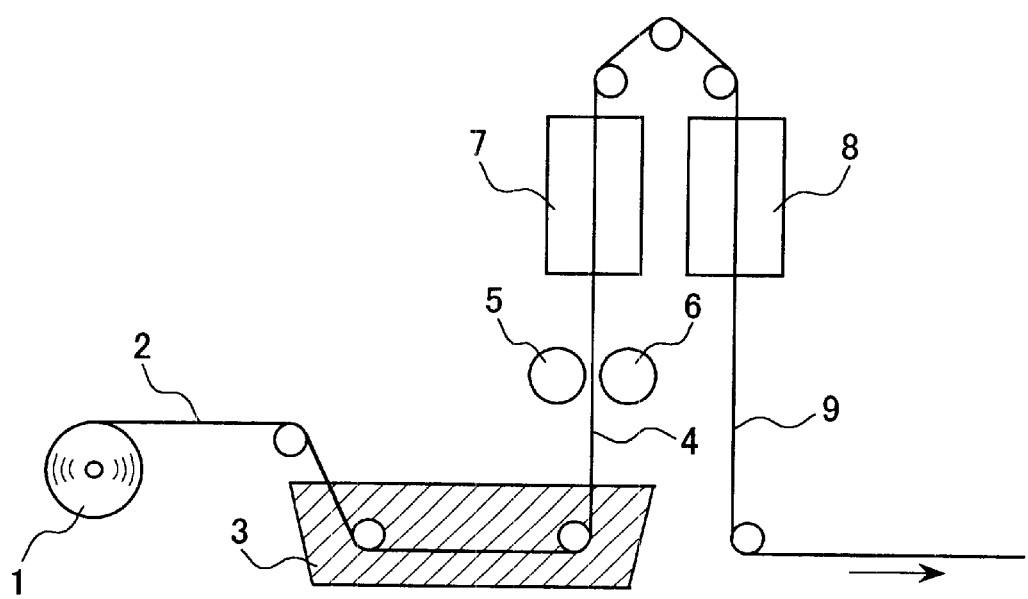
FIG. 5 is a drawing for describing a method for producing a glass-epoxy prepreg in one embodiment of the present invention.
Figure 6A:
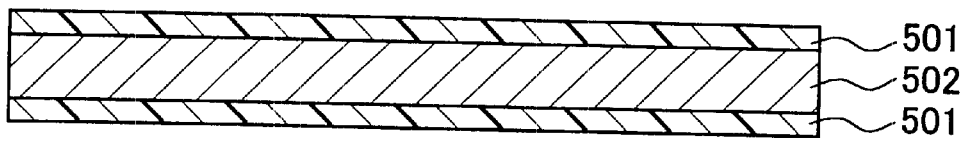
FIGS. 6A to 6G are sectional views illustrating processes in a conventional method for producing a multilayered circuit board.
Figure 6B:
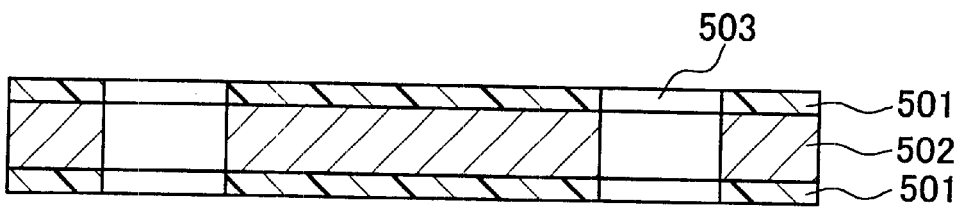
Figure 6C:
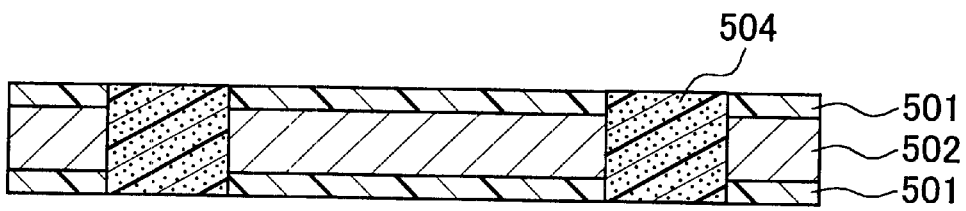
Figure 6D:
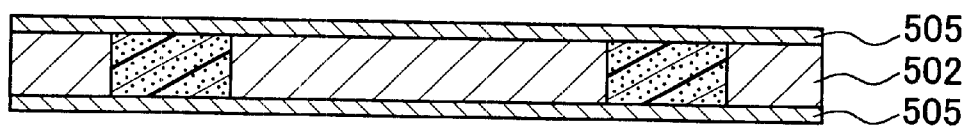
Figure 6E:
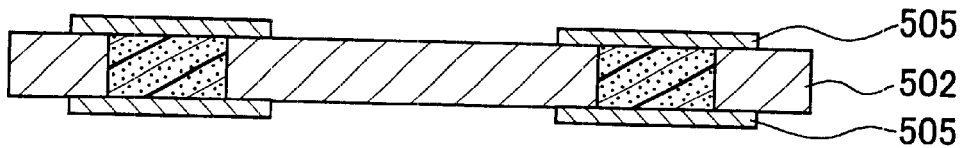
Figure 6F:
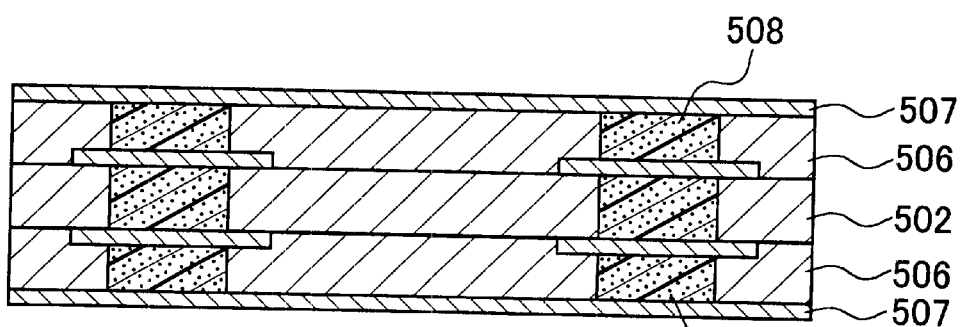
Figure 6G:
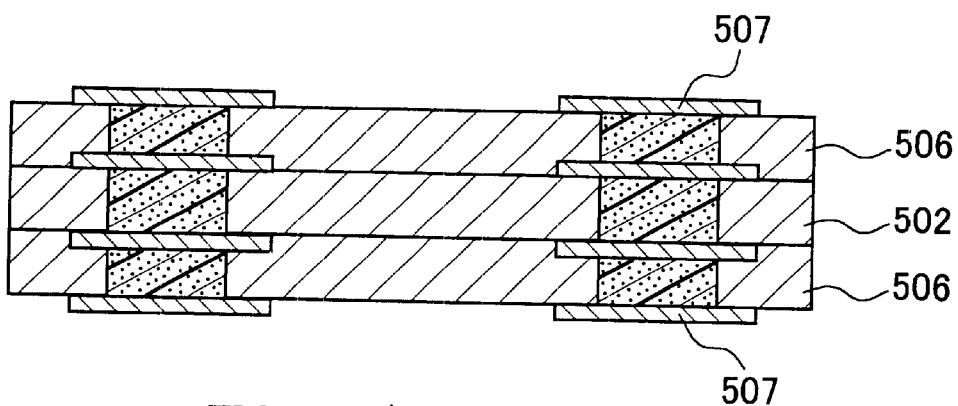

A glass-epoxy prepreg in the following embodiments was produced by a method for producing the glass-epoxy prepreg in one embodiment of the present invention shown in FIG. 5.

First, a glass cloth 2 was drawn out from a feed roller 1, put into an impregnation tank 3 of a liquid epoxy resin so as to be impregnated thoroughly with the resin, and lifted up to be passed between thickness-adjusting rollers 5 and 6. At this time, the thickness of epoxy resin layers on both sides of the glass cloth was adjusted. More specifically, when the gap between the surface of the glass cloth and the thickness-adjusting roller 5 was large, a thick epoxy resin layer was obtained. On the other hand, when the gap was small, a thin epoxy resin layer was obtained. Thus, by passing the glass cloth not at the center between the thickness-adjusting rollers 5 and 6 but closer to one of the rollers, it was possible to form the resin layers to be thicker on one surface than on the other surface. The thickness adjustment also may be made by other methods, such as with a doctor knife.

The glass cloth whose thickness had been adjusted as above then passed through a drying zone 7, in which a liquid component such as a solvent was removed. An initial curing also may be started.

Next, the glass cloth passed through a heat treatment zone 8, in which the epoxy resin was semi-cured or partially cured. Subsequently, a cured glass-epoxy prepreg 9 was pulled out and cut into a predetermined length.

First Embodiment

FIGS. 1A to 1H are sectional views illustrating processes in a method for producing a double-sided circuit board according to the first embodiment of the present invention. First, as shown in FIG. 1A, an electrical insulating base material 100 formed of a core layer 102 and resin layers 101a and 101b on both sides of the core layer 102 was prepared. As the core layer 102, a glass-epoxy prepreg obtained by impregnating a glass cloth with a thermosetting epoxy resin was used. A cloth for electrical insulation, manufactured by NITTO BOSEKI Co., Ltd., (product number: WE116E104, thickness: 100 $\mu$m, weight per unit area: 105 g/m$^2$, the number of warps: 60/25 mm and the number of wefts: 60/25 mm, single yarn, plain weave) was used for the glass cloth. The amount of impregnated resin was 54 wt %. Such glass-epoxy base material was characterized by having an excellent stiffness, a low water absorption and high adhesive properties, thus having high reliability as a material of the printed circuit board. The resin layers 101a and 101b were thermosetting epoxy resin formed on both sides of the glass cloth. The epoxy resin can be phenol novolac type, cresol novolac type or bisphenol type epoxy resin. More specifically, 2:1 mixture by weight of "EPIKOTE 6090" and "EPICURE YLH129," manufactured by JAPAN EPOXY RESINS CO., LTD., was used.

The resin layers 101a and 101b had a thickness different from each other, with the former being 10 $\mu$m, and the latter being 5 $\mu$m. The thermosetting epoxy resin was in a semi-cured state for ensuring that a wiring layer can be embedded therein.

Figure 1B:
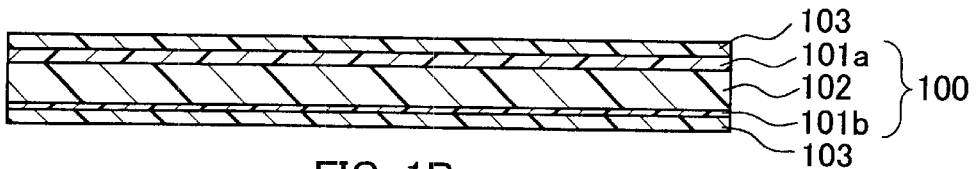

Next, as shown in FIG. 1B, release films 103 made of a material such as polyester were laminated on both surfaces of the electrical insulating base material 100 at about 120° C. Consequently, the surfaces of the resin layers 101a and 101b were melted slightly, thus permitting the release films 103 to adhere onto the resin layers 101a and 101b. In the present embodiment, polyethylene terephthalate (PET) films having a thickness of 16 $\mu$m were used as the release films 103.

Figure 1C:
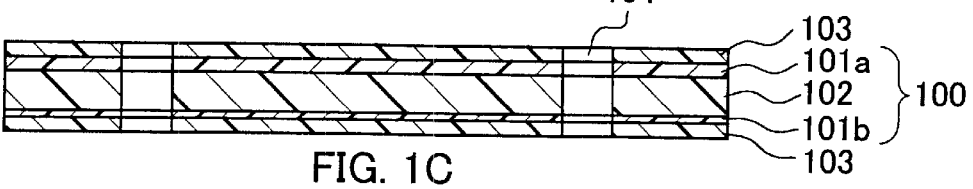

Then, as shown in FIG. 1C, through holes 104 were formed in the electrical insulating base material 100 provided with the release films 103 with a laser beam. The laser beam was irradiated under the condition of pulse width: 200 $\mu$s and attenuator: 270 pulse. The through holes 104 formed by the above-mentioned laser beam machine had a diameter of about 100 $\mu$m.

Figure 1D:
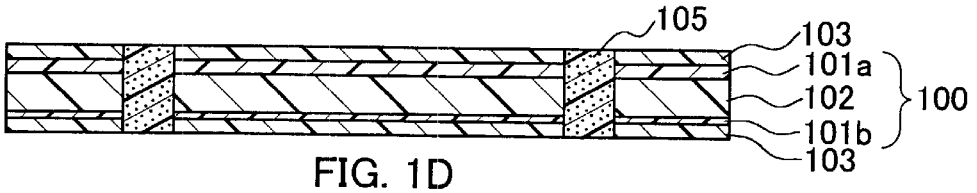

As shown in FIG. 1D, the through holes 104 were filled with an electrically conductive paste 105 by printing the electrically conductive paste 105 directly over the release film 103 using a screen printing machine. In this case, by a vacuum adsorption applied from the side opposite to the printed surface via a porous sheet such as Japan paper, a resin component contained in the electrically conductive paste 105 within the through holes 104 was absorbed, so as to increase the proportion of a conductor component. As a result, the through holes 104 were filled with the electrically conductive paste containing the denser conductor component. In addition, the release film 103 served as a print mask and a contamination preventer for the surfaces of the resin layers 101a and 101b.

Figure 1E:
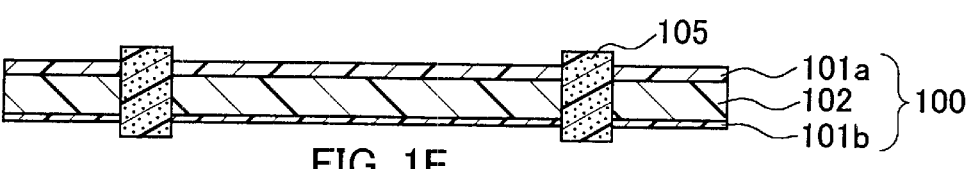

As shown in FIG. 1E, the release films 103 were peeled off from the both surfaces. In this case, owing to the minute through holes 104 with a diameter of 100 $\mu$m, the influence at the ends of the through holes of the release films 103 could not be ignored. Consequently, a part or a whole of the electrically conductive paste 105 within the through holes in the release films 103 sometimes was removed together with the release films 103. Although the electrically conductive paste 105 remained in various states, the remaining electrically conductive paste 105 was not scooped below the surfaces of the resin layers 101a and 101b. Even in the worst case, the surfaces of the electrically conductive paste 105 were flush with those of the resin layers 101a and 101b. Such removal of the electrically conductive paste by the release films 103 was found significantly when the diameter of the through holes 104 was reduced to 100 $\mu$m or less.

Figure 1F:
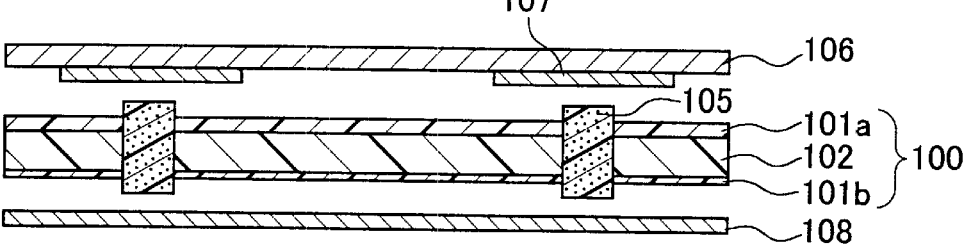

As shown in FIG. 1F, a base material (a sacrificial layer) 106 provided with a wiring layer 107 formed into a predetermined shape was superposed from the resin layer 101a side of the electrical insulating base material 102 such that at least the wiring layer 107 was positioned immediately above the portion filled with the electrically conductive paste 105. A metal foil 108 was superposed on the side of the other wiring layer 101b. They were then heated and compressed by a vacuum press under the condition of heat-up speed: 5° C./min, pressure: 30 kgf/cm$^2$, held at the maximum temperature of 180° C. for one hour, and degree of vacuum: 2.66×10$^3$ Pa (20 Torr) or less.

Figure 1G:
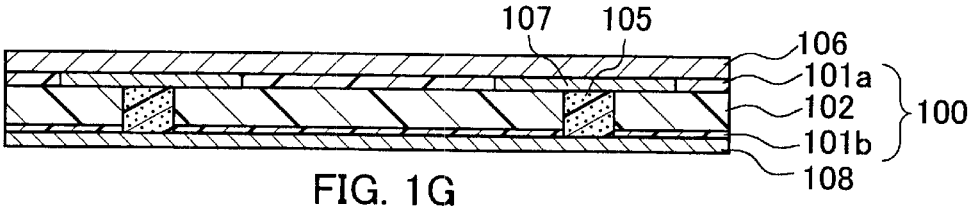

This heating and compression allowed the resin layer 101a to flow, so that the wiring layer 107 was embedded into the resin layer 101a as shown in FIG. 1G. By embedding the wiring layer 107 into the resin layer 101a as above, the electrically conductive paste 105 within the through holes 104 was compressed, and thus the resin component contained in the electrically conductive paste 105 flowed out into the resin layer 101a. Accordingly, the conductor component contained in the electrically conductive paste 105 became dense. Furthermore, since the resin layer 101b was thin with a thickness of 5 $\mu$m, it became possible to minimize an escape of pressure exerted on the electrically conductive paste owing to a resin flow in the resin layer. Thereafter, the electrically conductive paste 105 and the electrical insulating base material 100 including the resin layers 101a and 101b were cured.

Figure 1H:
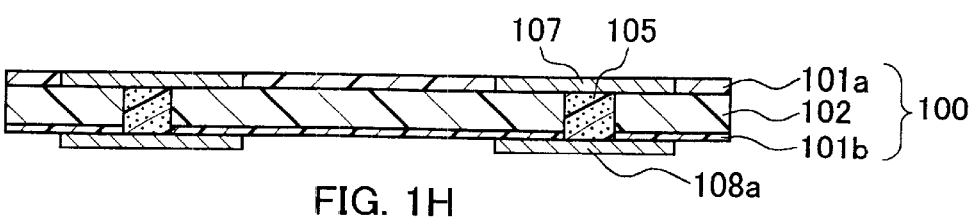

Finally, the sacrificial base material 106 was removed while leaving the wiring layer 107 embedded in the resin layer 101a as shown in FIG. 1H. Then, the metal foil 108 was patterned by etching so as to form a wiring layer 108a, thus completing a double-sided circuit board.

In the present embodiment, an aluminum foil was used for the sacrificial base material 106, and a copper foil was used for the wiring layers 107 and 108a. The sacrificial base material 106 was removed by melting the aluminum foil by selective etching of the aluminum foil and the copper foil. Since the sacrificial base material 106 was removed by melting the aluminum foil, the double-sided circuit board was not stressed so as to be broken. In addition, the sacrificial base material 106 was removed in a single step, thus improving the productivity. Ammonium persulfate or the like can be used as an etchant for the selective etching. The same method was applied to form the wiring layers 107 and 108a into a predetermined pattern. A composite material of the aluminum foil and the copper foil used for the sacrificial base material 106 and the wiring layer 107 was, for example, a copper foil with an aluminum carrier, UTC-Foil, manufactured by Mitsui Mining & Smelting Co., Ltd. The composite material allowed a fine pattern formation, since the copper foil was thin with a thickness of 5 to 12 $\mu$m. A similar composite material also may be obtained by preforming a resist pattern on an aluminum foil, treating it with acidic zincate, followed by copper electroplating. In the electroplating method, one having a thick copper foil and a fine pattern was obtained. In this method, one having a linewidth of 10 μm, a space of 10 μm, and a copper foil with a thickness of 15 μm was produced experimentally. In the present embodiment, the copper foil had a thickness of 12 μm and the aluminum foil had a thickness of 40 μm. Since the wiring layer 107 was designed to be thicker than the resin layer 101a, it became possible to minimize the escape of pressure exerted on the electrically conductive paste owing to spread of the resin layer in the horizontal direction.

Second Embodiment

In the following, a method for producing a multilayered circuit board according to the second embodiment of the present invention will be described with reference to FIGS. 2A to 2E.

Figure 2A:
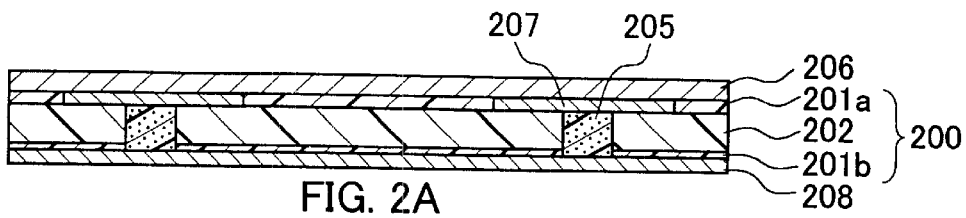
FIGS. 2A to 2E are sectional views illustrating processes in a method for producing a multilayered circuit board according to a second embodiment of the present invention.

First, as shown in FIG. 2A, a double-sided substrate with a sacrificial base material 206 attached thereto was produced in a similar manner to the first embodiment. Resin layers 201a and 201b had different thicknesses from each other, with the former being 10 μm, and the latter being 5 μm. A core layer 202 had a thickness of 100 μm. Numeral 200 denotes an electrical insulating base material, and numeral 205 denotes an electrically conductive paste filled in through holes provided in the electrical insulating base material 200. The electrically conductive paste 205 was compressed from one side by a wiring layer 207. Numeral 208 denotes a metal foil.

Figure 2B:
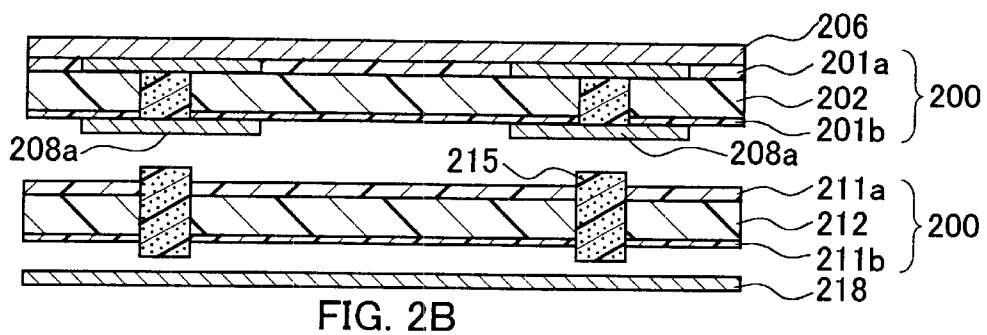

On one surface of the double-sided circuit board, which had been formed as above, the metal foil 208 was patterned to form a wiring layer 208a. Thereafter, as shown in FIG. 2B, the electrical insulating base material 200 in which resin layers 211a and 211b were formed and an electrically conductive paste 215 was filled at a predetermined position was placed on the side of the wiring layer 208a. On an outer side thereof, a metal foil 218 further was superposed, followed by heating and compressing similar to the first embodiment. At this time, the wiring layer 208a and the portion of the electrically conductive paste 215 were positioned to match each other. The resin layers 211a and 211b had different thicknesses from each other, with the former being 10 μm, and the latter being 5 μm. They were heated and compressed by a vacuum press under the condition of heat-up speed: 5° C./min, pressure: 30 kgf/cm$^2$, held at the maximum temperature of 180° C. for one hour, and degree of vacuum: 2.66×10$^3$ Pa (20 Torr) or less.

Figure 2C:
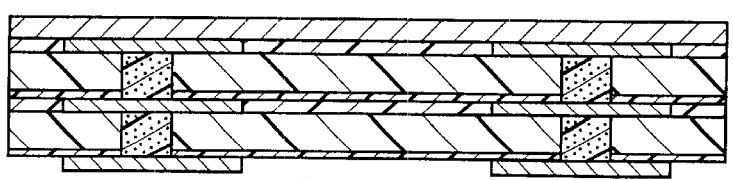

This heating and pressurization allowed the resin layer 211a to flow, so that the wiring layer 208a was embedded into the resin layer 211a as shown in FIG. 2C. By embedding the wiring layer 208a into the resin layer 211a as above, the electrically conductive paste 215 was compressed, and thus the resin component contained in the electrically conductive paste 215 flowed out into the resin layer 211a. Accordingly, the conductor component contained in the electrically conductive paste 215 became dense. Furthermore, since the resin layer 211b was thin with a thickness of 5 μm, it became possible to minimize an escape of pressure exerted on the electrically conductive paste owing to a resin flow in the resin layer 211b. Thereafter, the electrically conductive paste 215 and the electrical insulating base material 200 including the resin layers 211a and 211b were cured, similar to the first embodiment.

Figure 2D:
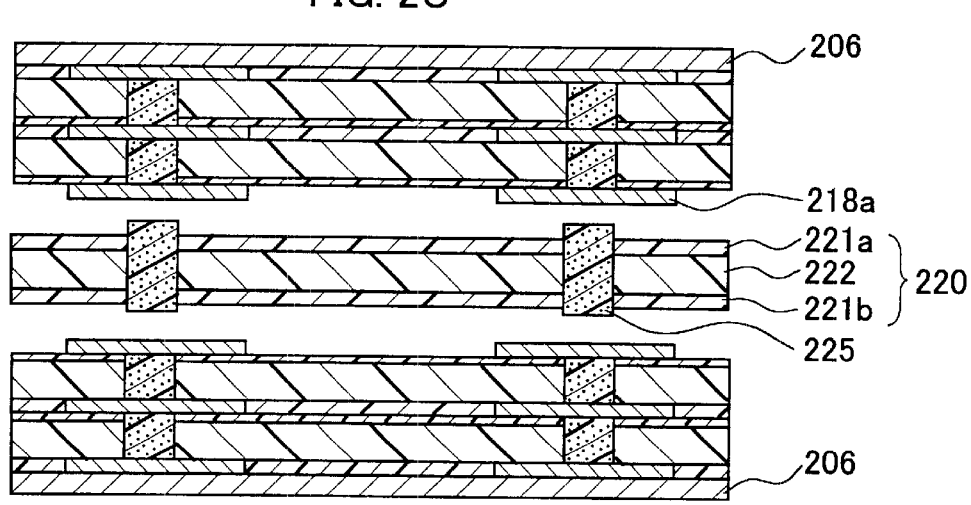

In the multilayered circuit board formed as above, the metal foil 218 was patterned so as to form a wiring layer 218a. Subsequently, as shown in FIG. 2D, an electrical insulating base material 220 provided with resin layers 221a and 221b on both sides of a core layer 222 formed of a glass cloth with a thickness of 100 μm impregnated with epoxy resin and filled with an electrically conductive paste 225 at a predetermined position was placed at the center. Then, on each side thereof, the multilayered circuit board described above was superposed such that the wiring layer 218a side contacts the electrical insulating base material 220, followed by heating and compression under the condition of heat-up speed: 5° C./min, pressure: 30 kgf/cm$^2$, held at the maximum temperature of 180° C. for one hour, and degree of vacuum: 2.66×10$^3$ Pa (20 Torr) or less. The thickness of the resin layers 221 was 10 μm on both sides.

Figure 2E:
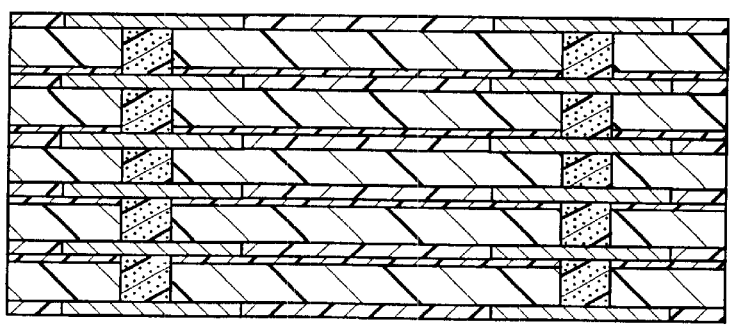

This heating and compression allowed the resin layer 221 to flow, so that the wiring layer 218a was embedded into the resin layer 221 as shown in FIG. 2E. By embedding the wiring layer 218a into the resin layer 221 as above, the electrically conductive paste 225 was compressed, and thus the resin component contained in the electrically conductive paste 225 flowed out into the resin layer 221. Accordingly, the conductor component contained in the electrically conductive paste 225 became dense. Thereafter, the electrically conductive paste 225 and the electrical insulating base material 220 including the resin layers 221 were cured. Finally, the sacrificial base material 206 was removed, thus completing a multilayered circuit board.

In the present embodiment, an aluminum foil was used for the sacrificial base material 206, and a copper foil was used for the wiring layers 207, 208a and 218a. The copper foil had a thickness of 12 μm, and the aluminum foil had a thickness of 40 μm.

The multilayered circuit board of the present embodiment had a smooth surface. Therefore, when mounting semiconductor bare chips, the excellent flatness of the surface under the chips brought about high mounting yield, thus improving mounting reliability.

Third Embodiment

In the following, a method for producing a multilayered circuit board according to the third embodiment of the present invention will be described with reference to FIGS. 3A to 3E.

Figure 3A:
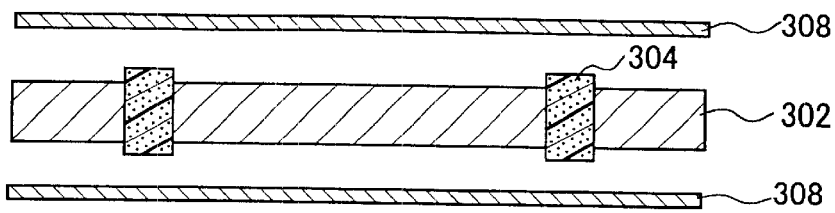
FIGS. 3A to 3E are sectional views illustrating processes in a method for producing a multilayered circuit board according to a third embodiment of the present invention.

First, as shown in FIG. 3A, an electrical insulating base material 302 that was filled with an electrically conductive paste 304 at a predetermined position was prepared. As the electrical insulating base material 302, an aramid-epoxy prepreg (thickness: 130 μm, weight per unit area: 140 g/m$^2$) that was obtained by impregnating an aramid nonwoven fabric with a thermosetting epoxy resin was used. Metal foils 308 with a thickness of 12 μm were superposed on both surfaces of the electrical insulating base material 302.

Figure 3B:
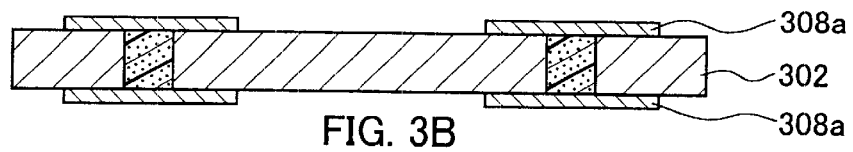

Next, as shown in FIG. 3B, they were heated and compressed by a vacuum press under the condition of heat-up speed: 5° C./min, pressure: 30 kgf/cm$^2$, held at the maximum temperature of 180° C. for one hour, and degree of vacuum: 2.66×10$^3$ Pa (20 Torr) or less, so as to cure the electrical insulating base material 302 and the electrically conductive paste 304. Subsequently, wiring layers 308a were formed by patterning.

Figure 3C:
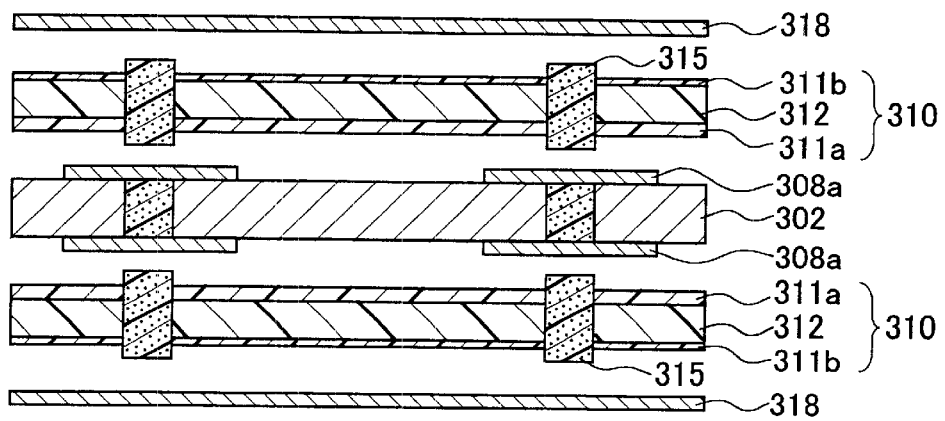

Next, two electrical insulating base materials 310, similar to the one used in the first embodiment, in which resin layers 311a and 311b were formed on both sides of a core layer 312 and an electrically conductive paste 315 was filled at a predetermined position, were prepared. Then, as shown in FIG. 3C, they were placed on both surfaces of the double-sided circuit board produced in FIG. 3B. In this case, the electrical insulating base materials 310 were superposed from the side of the resin layers 311a such that at least the wiring layers 308a were positioned immediately above the portion filled with the electrically conductive paste 315. Metal foils 318 were superposed on the side of the other wiring layers 311b, followed by heating and compressing under the condition of heat-up speed: 5° C./min, pressure: 30 kgf/cm², held at the maximum temperature of 180° C. for one hour, and degree of vacuum: 2.66×10³ Pa (20 Torr) or less. The resin layers 311a and 311b had different thicknesses from each other, with the former being 10 μm, and the latter being 5 μm.

Figure 3D:
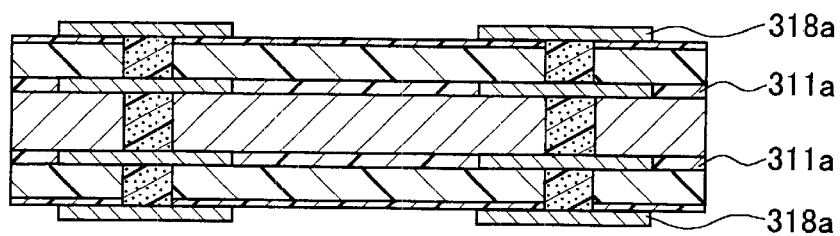

This heating and compression allowed the resin layers 311a to flow, so that the wiring layers 308a were embedded into the resin layers 311a as shown in FIG. 3D. By embedding the wiring layers 308a into the resin layers 311a as above, the electrically conductive paste 315 was compressed, and thus the resin component contained in the electrically conductive paste 315 flowed out into the resin layers 311a. Accordingly, the conductor component contained in the electrically conductive paste 315 became dense. Furthermore, since the resin layers 311b were thin with a thickness of 5 μm, it became possible to minimize an escape of pressure exerted on the electrically conductive paste owing to a resin flow in the resin layers 311b. Thereafter, the electrically conductive paste 315 and the electrical insulating base material 310 including the resin layers 311a and 311b were cured. Then, the metal foils 318 were patterned so as to form wiring layers 318a, thus completing a four-layered circuit board.

Figure 3E:
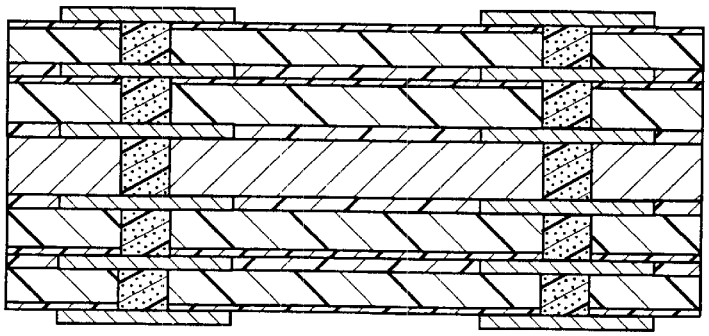

Finally, with further laminations by repeating the processes shown in FIGS. 3C and 3D, a six-layered circuit board was completed as shown in FIG. 3E.

In the present embodiment, copper foils having a thickness of 12 μm were used for the wiring layers 308a and 318a.

In the multilayered circuit board of the present embodiment, an aramid-epoxy base material was used for a core substrate in which the electrically conductive paste was not compressed very much, while a glass-epoxy base material was used for outer substrates in which the electrically conductive paste was compressed. Consequently, it was possible to achieve characteristics such as an excellent stiffness, low water absorption and high adhesive properties, thus obtaining still higher reliability.

Fourth Embodiment

In the following, a method for producing a multilayered circuit board according to the fourth embodiment of the present invention will be described with reference to FIGS. 4A to 4C. First, a fine circuit board 410 having a predetermined number of insulating layers and wiring patterns and a core substrate 411, produced similarly to the process of FIG. 2C in the second embodiment, were prepared. In the present embodiment, a polyimide film having both surfaces provided with epoxy-based adhesive layers was used as an electrical insulating base material of the fine circuit board 410. Through holes filled with an electrically conductive paste had a diameter of 50 μm. A copper foil with a thickness of 5 μm was used for the wiring layer on the fine circuit board, and that with a thickness of 12 μm was used for the wiring layer on the core substrate.

Figure 4A:
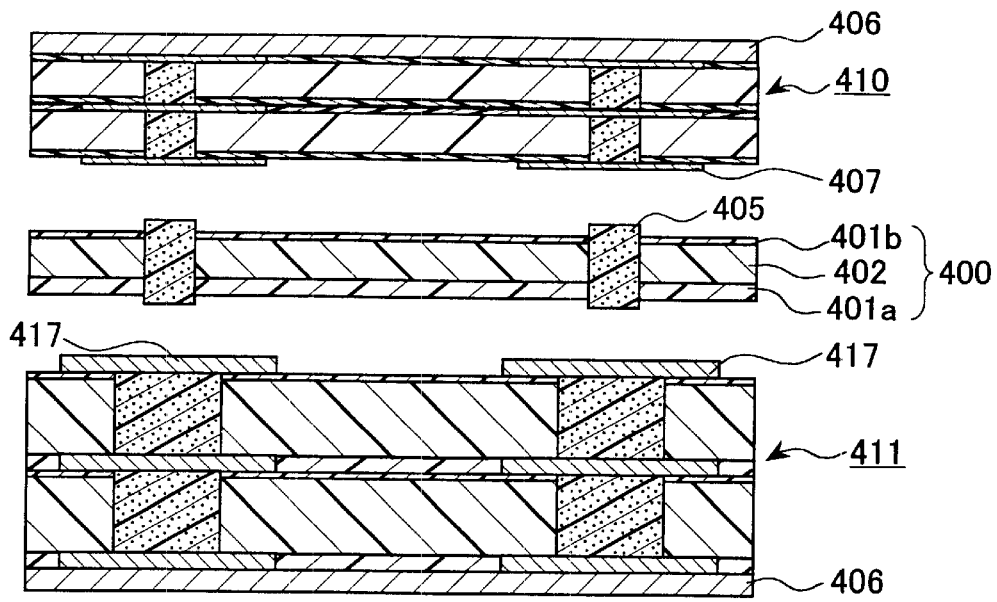
FIGS. 4A to 4C are sectional views illustrating processes in a method for producing a multilayered circuit board according to a fourth embodiment of the present invention.

Next, as shown in FIG. 4A, the fine circuit board 410 and the core substrate 411 were superposed on both sides of an electrical insulating base material 400 provided with resin layers 401a and 401b, having different thicknesses, on both sides of a core layer 402 and filled with an electrically conductive paste 405 at a predetermined position. The resin layers 401a and 401b had different thicknesses from each other, with the former being 10 μm, and the latter being 5 μm. The core layer 402 had a thickness of 100 μm. In this case, the core substrate 411 was arranged on the side of the resin layer 401a, and the fine circuit board 410 was arranged on the side of the resin layer 401b. In addition, wiring layers 407 and 417 and the portion of the electrically conductive paste 405 were positioned to match each other. Numerals 406 denote sacrificial substrates.

Figure 4B:
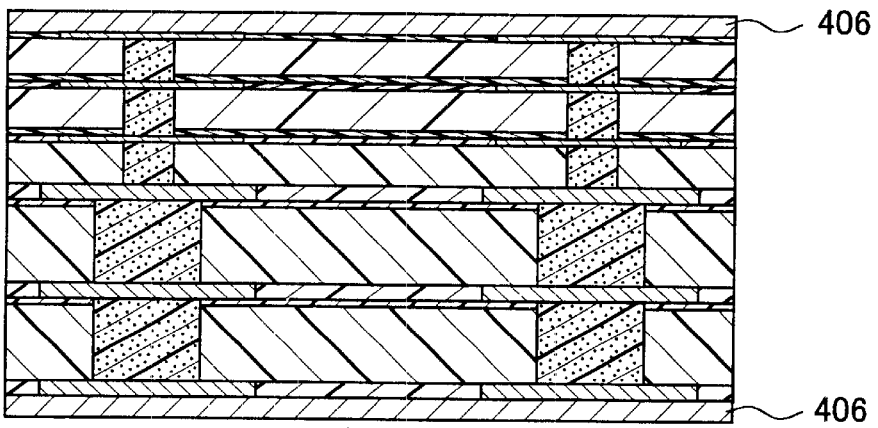

Thereafter, as shown in FIG. 4B, the assembly was heated and compressed by a vacuum press, so as to embed the wiring layer 407 on the surface of the fine wiring board 410 and the wiring layer 417 on the surface of the core substrate 411 into the resin layers 401b and 401a respectively, thereby compressing the electrically conductive paste 405. In this manner, the fine wiring board 410 and the core substrate 411 were electrically connected to each other.

Figure 4C:
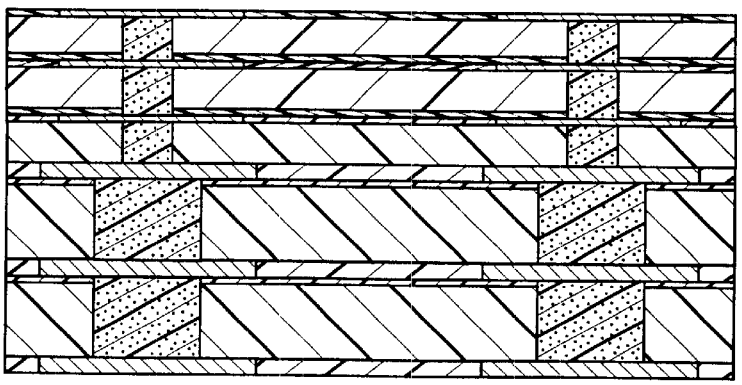

Finally, as shown in FIG. 4C, the sacrificial substrates 406 on the surfaces of the fine wiring board 410 and the core substrate 411 were removed, thus completing a multilayered circuit board. By providing the core substrate below the fine wiring board, which was a substrate having a large capacity of wiring, it became possible to produce a high-density circuit board with a high stiffness.

The multilayered circuit board of the present embodiment had the electrical insulating base material in which the resin layers formed on both sides of the glass cloth had a thickness equal to or smaller than that of the wiring layers embedded in these resin layers. Therefore, the wiring layers can be embedded substantially to the glass cloth, making it possible to minimize an escape of pressure exerted on the electrical conductor owing to spread of the resin layer in a horizontal direction and to achieve a via-hole connection with high reliability.

According to the method for producing the multilayered circuit board of the present embodiment, the multilayered circuit board on the surface and the core substrate can be produced and inspected individually, thereby improving yield as a whole.

As described above, by adjusting the thickness of the resin layers formed on both sides of the resin holder such as the glass cloth, the via-hole connection with high reliability can be provided when layers are electrically connected by the electrical conductor such as the electrically conductive paste.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A printed circuit board comprising:
   an electrical insulating base material with through holes that are formed in a thickness direction of the electrical insulating base material and are filled with an electrical conductor; the electrical insulating base material comprising
      a core layer formed by impregnating a holder with a resin, and
      resin layers formed on both sides of the core layer; and
   wiring layers that are formed on both surfaces of the electrical insulating base material into a predetermined pattern and are electrically connected to each other by the electrical conductor;
   wherein the wiring layer is embedded in at least one of the resin layers,
   the resin layers on the both sides have a thickness different from each other, and a thinner layer out of the resin layers has a thickness equal to or smaller than a mean particle diameter of an electrically conductive filler contained in the electrical conductor.

2. The printed circuit board according to claim 1, wherein the electrical conductor is an electrically conductive paste containing the electrically conductive filler and a resin.

3. The printed circuit board according to claim 1, wherein the resin layers formed on both sides of the core layer have a thickness equal to or smaller than that of the wiring layer embedded in the resin layers.

4. The printed circuit board according to claim 1, wherein the through holes are formed by a laser beam irradiation.

5. The printed circuit board according to claim 1, wherein one of the resin layers on the both sides is more than one and less than ten times as thick as the other.

6. The printed circuit board according to claim 5, wherein one of the resin layers on the both sides is two to four times as thick as the other.

7. The printed circuit board according to claim 1, wherein the holder is a glass cloth.

8. The printed circuit board according to claim 1, wherein the resin is a thermosetting epoxy resin.

9. The printed circuit board according to claim 1, wherein a plurality of the printed circuit boards are laminated.

* * * * *